United States Patent

Williams

[15] 3,679,910

[45] July 25, 1972

[54] TOUCH CONTROL SWITCH

[72] Inventor: James M. Williams, Waltham, Mass.

[73] Assignee: Massachusetts Institute of Technology, Cambridge, Mass.

[22] Filed: April 13, 1971

[21] Appl. No.: 133,591

[52] U.S. Cl. ..........................307/252 W, 307/247, 307/308

[51] Int. Cl. ........................................................H03k 17/00

[58] Field of Search............307/252 A, 252 UA, 247 A, 308; 328/5; 331/65; 340/258 C, 258 W; 317/DIG. 2

[56] References Cited

UNITED STATES PATENTS

| | | | |
|---|---|---|---|
| 3,392,348 | 7/1968 | Horwitz | 331/65 X |
| 3,255,380 | 6/1966 | Atkins et al. | 340/158 C |
| 3,327,231 | 6/1967 | Guggenbuhl | 307/247 R |

*Primary Examiner*—Donald D. Forrer
*Assistant Examiner*—B. P. Davis
*Attorney*—Thomas Cooch, Martin M. Santa and Robert Shaw

[57] ABSTRACT

A circuit which is responsive to sixty cycle voltage coupled to the circuit by a human body from a proximate 60 cycle power line. An input terminal when touched by a person's finger has coupled into it a 60 cycle voltage which is amplified and causes the electronic circuitry to assume either a conducting or non-conducting state at its output which is maintained after removal of the finger from the terminal. The output of the circuit is connected to a controlled device which is controlled by the circuit output state.

5 Claims, 1 Drawing Figure

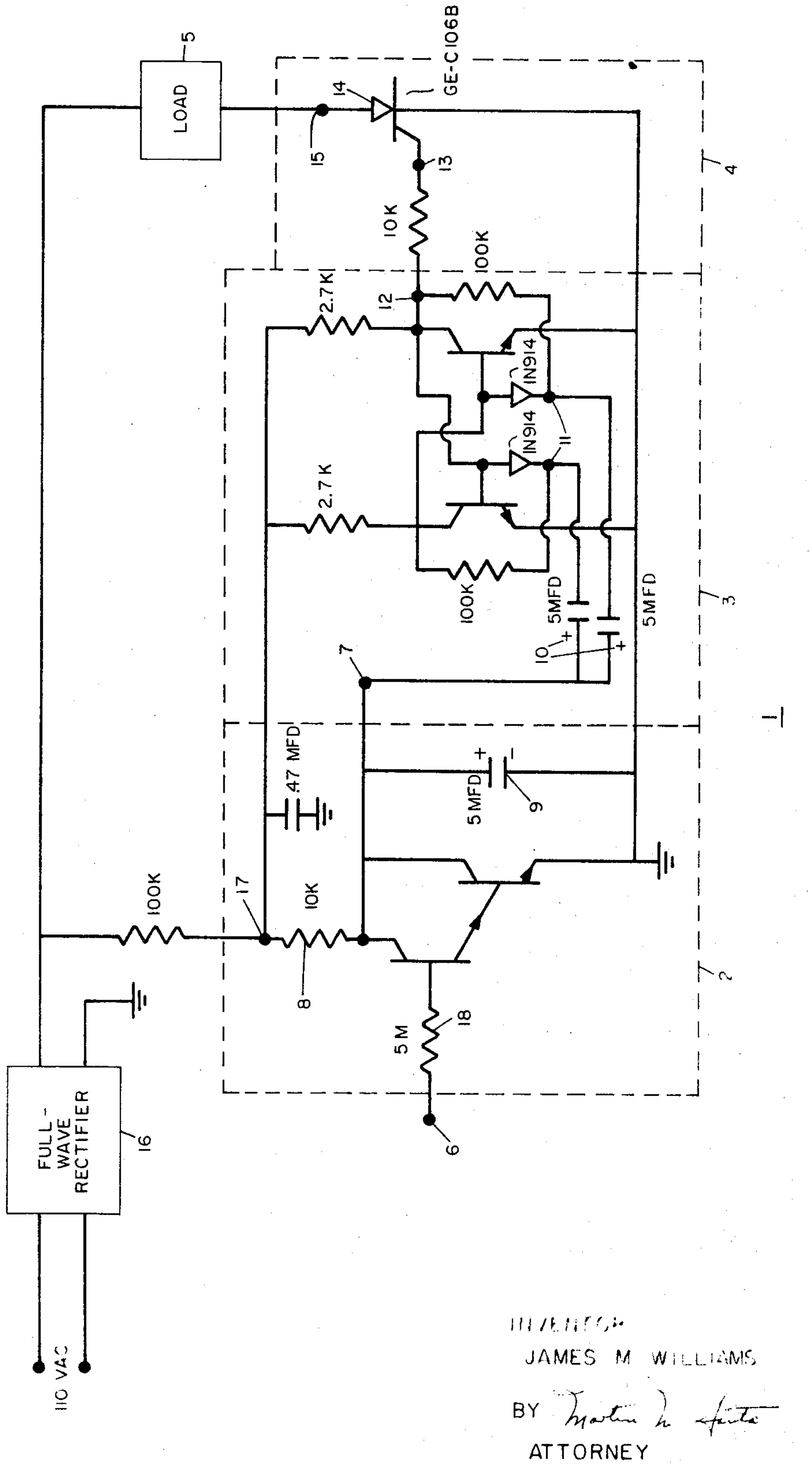
INVENTOR
JAMES M WILLIAMS
BY Martin [signature]
ATTORNEY

TOUCH CONTROL SWITCH

This invention relates to electrical switches and in particular to a switch which is controlled by the proximity of a person's finger without mechanical motion of a part of the switch.

There presently exist electrical switches which are activated by the proximity of a person's finger as in the circuit of this invention. These switches are believed to operate generally on the principle of using the proximity of the finger to a circuit element to vary the capacitance in a resonant circuit of a free running oscillator and thus cause the frequency of the oscillator to change. The change in frequency is detected and causes the circuit to energize or deenergize a controlled device. The circuit remains in that condition when the finger is removed from the capacity sensitive region of the circuit. A subsequent proximity of the finger causes the circuit to assume a conducting state opposite that which existed prior thereto.

In contrast, the touch control switch of the present invention has no free free-running oscillator but rather is activated by coupling into a circuit by body capacitance to a sixty cycle power source field which exists from the power source. The sixty cycle electric field is coupled into the input of the circuit by touching or having a portion of the body such as a finger in proximity to the circuit.

The input voltage thus coupled into the circuit is very small but is sufficient to be amplified in a high gain amplifier. The output of the amplifier is coupled into a circuit, in the preferred embodiment a multivibrator is used, which will change its state upon sensing a signal from the amplifier but will retain that state in the absence of a signal from the amplifier. A subsequent signal from the amplifier causes the multivibrator to change its state. The state of the multivibrator is coupled to an electrically controlled switch, a semiconductor controlled rectifier in the preferred embodiment, which is caused to be conducting for one state and non-conducting for the other state of the multivibrator. The controlled rectifier output controls an incandescent light bulb or other load.

It is therefore an object of this invention to provide an electrical switch which is controlled by the proximity of or touching by a person without requiring the movement of a mechanical device.

It is a further object of this invention to provide a reliable switch which is immune from switching by spurious electrical signals wither present in the surrounding environment or on the electrical power lines to which the switching circuit is connected.

Further objects and features will be apparent from the following detailed description of the FIGURE containing the preferred embodiment.

The touch control circuit 1 comprises an amplifier 2 which drives a bi-stable multivibrator 3 which in turn controls the conduction state of a semiconductor device 4 connected to the load 5. The amplifier 2 is a standard high gain circuit which is capable of amplifying the sixty cycle signal applied to its input 6 when touched by or by the proximity of the finger of a person exposed to the electric field produced by a sixty cycle power line on apparatus powered thereby. A five megohm input resistor 18 protects the person touching terminal 6 from any possibility of electrical shock.

In response to the sixty cycle signal applied at its input 6, amplifier 2 produces a signal at its output 7 which is capable of triggering the bistable multivibrator 3 and changing its output state at terminal 12. In order to cause the multivibrator 3 to trigger only once for each touch of terminal 6 regardless of the length of time terminal 6 is touched, amplifier 2 is caused to have a large time constant output circuit. This time constant is about 0.05 sec in the preferred embodiment as provided by the 10K amplifier load resistor 8 and the 5 MFD capacitor 9. Therefore, the signal on terminal 7 which causes triggering of multivibrator 3 is a negative step waveform which is initiated at the time terminal 6 is touched and which terminates when the finger is removed from terminal 6. The negative going portion of the voltage at terminal 7 is coupled through the 5 MFD capacitors 10 and diodes 11 to cause the multivibrator 3 to be triggered and change its state from high to low or vice versa at its output terminal 12.

The output of multivibrator 3 is connected to the control terminal 13 of the semiconductor rectifier 14 to cause rectifier 14 to become conducting or non-conducting when the voltage on terminal 13 is high or low, respectively. Output 15 of rectifier 14 is connected to the load 5 which is energized from the power source 16 which for the preferred embodiment is a rectified a.c. source because the semiconductor controlled rectifier 14 requires a d.c. power source. If the load is non-sensitive to the nature of the source of power, such as an incandescent light bulb, a semiconductor controlled rectifier may be used with a d.c. source which may be unfiltered. If the load is one which requires an alternating power source, the switch 14 must be of the type which will control alternating power with a d.c. control voltage at its input terminal. An example of such a switch is the TRIAC.

It has been found that the circuit 1 is rendered immune to transients on the power supply line or to sources of radiated noise signals such as the starting transient produced by a fluorescent light circuit if the amplifier 2 and multivibrator 3 are designed to operate on very low voltages as in the preferred embodiment where the d.c. voltage at terminal 17 is only 2 volts.

Thus, while there has been described above a preferred embodiment incorporating the principles of this invention, it is to be recognized that other embodiments incorporating these principles will be apparent to those skilled in the art and will fall within the scope of the invention as claimed.

What is claimed is:

1. An electrical switch responsive to the body-capacity coupled sixty cycle electric field of adjacent electrical power sources comprising:

a high gain amplifier having an input and an output terminal, an electrical network, said amplifier output terminal being connected to said electrical network which has a time constant of the order of the period of the sixty cycle electric field; said amplifier and network being responsive to a sixty cycle signal applied to the amplifier input terminal to provide a step change in voltage in one direction at the output of said network when the signal is applied, with constant output voltage while said input signal is applied without interruption, and a step change in voltage in the opposite direction when said signal is removed;

a bistable circuit connected to said network output and responsive to said step change in voltage to change its state only when said network output voltage changes in said one direction, and non-responsive to changes in the opposite direction or during the time said input signal is applied without interruption;

said bistable circuit having an output connected to the input of a voltage controllable switch whose conductivity at the output terminal is determined by the state of the bistable circuit to which it is connected;

whereby an electrical load connected to the switch output terminal is energized when said switch is electrically conductive as determined by the state of the bistable circuit.

2. The apparatus of claim 1 wherein said high gain amplifier and said bistable circuit are connected to a low direct voltage source of several volts whereby said switch circuit is rendered insensitive to spurious electrical signals present in the switch environment.

3. The apparatus of claim 1 wherein said electrical network comprises a capacitor connected across the output of said amplifier, said amplifier having an output resistance which in conjunction with said capacitor produces an output network having the desired time constant.

4. The apparatus of claim 1 wherein said voltage controllable switch is a semiconductor controlled rectifier whose input is connected to the output of said multivibrator and whose output is connected to an electrical load.

5. The apparatus of claim 1 wherein said electrical network comprises a capacitor connected across the output of said amplifier, said amplifier having an output resistance which in conjunction with said capacitor produces an output network having the desired time constant, and said bistable circuit is a bistable multivibrator whose input is connected to said capacitor.

* * * * *